(12) United States Patent
Inoue

(10) Patent No.: US 6,628,153 B2
(45) Date of Patent: Sep. 30, 2003

(54) PLL CIRCUIT AND FREQUENCY DIVISION METHOD REDUCING SPURIOUS NOISE

(75) Inventor: Shinichi Inoue, Satsuma (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/925,793

(22) Filed: Aug. 10, 2001

(65) Prior Publication Data

US 2002/0070780 A1 Jun. 13, 2002

(30) Foreign Application Priority Data

Oct. 20, 2000 (JP) ........................................ 2000-320936

(51) Int. Cl.[7] ................................................. H03L 7/06
(52) U.S. Cl. ........................................ 327/156; 327/379
(58) Field of Search ............................... 327/156, 147, 327/115, 117, 163, 2, 379, 157

(56) References Cited

U.S. PATENT DOCUMENTS

| | | | | |
|---|---|---|---|---|
| 5,757,216 A | * | 5/1998 | Murata | 327/147 |
| 5,864,249 A | * | 1/1999 | Shoji | 327/156 |
| 5,892,405 A | | 4/1999 | Kamikubo et al. | |
| 5,907,253 A | * | 5/1999 | Davis et al. | 327/156 |
| 6,130,561 A | | 10/2000 | Dufour | |
| 6,259,293 B1 | * | 7/2001 | Hayase et al. | 327/147 |

FOREIGN PATENT DOCUMENTS

| | | |
|---|---|---|
| GB | 2107142 A | 4/1983 |
| GB | 2150775 A | 7/1985 |
| GB | 2228840 A | 9/1990 |
| JP | 11-225072 | 8/1999 |

OTHER PUBLICATIONS

Copy of German Office Action w/translation.

* cited by examiner

*Primary Examiner*—Timothy P. Callahan
*Assistant Examiner*—Cassandra Cox
(74) *Attorney, Agent, or Firm*—Armstrong, Westerman & Hattori LLP

(57) ABSTRACT

A phase-locked loop (PLL) circuit performing a fractional division includes a phase comparator circuit, a phase difference signal modulation circuit, and an oscillator circuit. The phase comparator circuit compares phases of two signals and outputs first and second phase difference signals. The phase difference signal modulation circuit modulates the second phase difference signals into third phase difference signals, and the oscillator circuit oscillates based on the first and third signals.

9 Claims, 7 Drawing Sheets

PLL CIRCUIT AND FREQUENCY DIVISION METHOD REDUCING SPURIOUS NOISE

BACKGROUND OF THE INVENTION

1. Field of the Invention

The present invention relates to fractional-N (fractional Number) phase-locked loop (PLL) circuits (hereinafter referred to simply as PLL circuits) that create multiple signals each with a different frequency. The present invention also relates to frequency division methods.

2. Description of the Related Art

It is desired of PLL circuits employed in recent mobile communication devices to quickly switch the frequency of an output signal to a desired frequency so that the mobile communication devices are used with more convenience.

FIG. 1 is a diagram showing a structure of a conventional PLL circuit. As shown in FIG. 1, the PLL circuit includes an oscillator 1, a prescaler 2, a shift register 3, a reference divider 4, a swallow counter 5, a main counter 6, an accumulator 7, a cancellation signal control circuit 8, a phase comparator 9, a charge pump 10, a low-pass filter (LPF) 11, and a voltage-controlled oscillator (VCO) 12.

The reference divider 4 is connected to the oscillator 1 and the shift register 3, and the accumulator 7 is connected to the shift register 3. The cancellation signal control circuit 8 is connected to the accumulator 7, and the phase comparator 9 is connected to the reference divider 4 and the main counter 6.

The charge pump 10 is connected to the phase comparator 9 and the cancellation signal control circuit 8, and the LPF 11 is connected to the charge pump 10. The VCO 12 is connected to the LPF 11. The prescaler 2 is connected to the VCO 12, the swallow counter 5, and the main counter 6. The swallow counter 5 is connected to the prescaler 2, the shift register 3, and the accumulator 7. The main counter 6 is connected to the prescaler 2 and the shift register 3.

FIG. 2 is a circuit diagram showing a structure of the phase comparator 9. As shown in FIG. 2, the phase comparator 9 includes inverting circuits 41 through 63 and NAND circuits 81 through 98, and outputs pulse signals ΦP and ΦR on the basis of a phase difference between a supplied reference signal fr and comparison frequency signal fp.

In the PLL circuit of the above-described structure, the oscillator 1 supplies a reference clock signal CK with the natural frequency of a crystal oscillator to the reference divider 4. The reference divider 4, which is formed of a counter circuit, frequency-divides the reference clock signal CK by a division ratio set by data supplied from the shift register 3. Then, the reference divider 4 supplies the reference signal fr generated by the division to the phase comparator 9.

The main counter 6 supplies the comparison frequency signal fp to the phase comparator 9, which outputs to the charge pump 10 the pulse signals ΦP and ΦR on the basis of the phase difference between the reference signal fr and the comparison frequency signal fp.

The charge pump 10 generates an output signal VOUT on the basis of the pulse signals ΦP and ΦR supplied from the phase comparator 9, and supplies the output signal VOUT to the LPF 11. The LPF 11 smoothes the supplied output signal VOUT by removing high-frequency components therefrom to generate an output signal DOUT. The LPF 11 supplies the output signal DOUT to the VCO 12.

The VCO 12 outputs a signal fvco with a frequency corresponding to the voltage value of the output signal DOUT supplied from the LPF 11, and outputs the signal fvco to the prescaler 2.

The prescaler 2 frequency-divides the input signal fvco by M or M+1 (M: natural number) to generate a signal POUT, and supplies the signal POUT to the main counter 6 and the swallow counter 5. The swallow counter 5 frequency-divides the signal POUT supplied from the prescaler 2 by N, and, if supplied with an overflow signal OVF from the accumulator 7, frequency-divides the signal POUT by N+1 for a given period of time (N: natural number). The prescaler 2 sets the division ratio to M or M+1 depending on a signal MD supplied from the swallow counter 5 and the main counter 6.

The above-described PLL circuit shown in FIG. 1 employs a fractional division setting method to enable fast phase lock, thus including the swallow counter 5 and the main counter 6. In the above-described PLL circuit, a fraction F is supplied to the shift register 3, which supplies a modulus QM for determining phase comparison timing in the phase comparator 9 and the fraction F to the accumulator 7.

The accumulator 7 subtracts the fraction F from the modulus QM at every phase comparison timing in the phase comparator 9, and supplies the overflow signal OVF to the swallow counter 5 when the subtraction result becomes zero.

Thus, in the PLL circuit of FIG. 1 functioning as a fractional-N synthesizer, the division ratio varies with time. Therefore, even after a frequency lock, the phase comparator 9 outputs the pulse signals ΦP and ΦR based on the phase difference to the charge pump 10, which outputs the signal VOUT (a jitter) based on the supplied pulse signals ΦP and ΦR to the LPF 11.

The LPF 11 outputs the signal DOUT, and the VCO 12 performs frequency modulation based on the signal DOUT. Therefore, the output spectrum of the VCO 12 includes an spurious output with a frequency that is a multiple of the frequency of the signal fvco which multiple is an integral multiple of a channel step (the fraction F).

In order to reduce the spurious output resulting from fluctuations in the signal VOUT output from the charge pump 10, the PLL circuit of FIG. 1 includes the accumulator 7 and the cancellation signal control circuit 8.

The cancellation signal control circuit 8, based on a signal ACMD supplied from the accumulator 7, generates a signal SPC having a pulse width proportional to the fluctuation width (a jitter width) of the signal VOUT and supplies the signal SPC to the charge pump 10, thereby controlling the fluctuations in the signal VOUT output from the charge pump 10 to reduce the spurious output.

However, in the conventional PLL circuit of FIG. 1, it is necessary for the cancellation signal control circuit 8 to supply the signal SPC to the charge pump 10 with good accuracy in supply timing so as to effectively cancel spurious noise included in the jitter output of the charge pump 10. This makes timing control in the cancellation signal control circuit 8 difficult and causes the cancellation signal control circuit 8 to be large in size.

SUMMARY OF THE INVENTION

It is a general object of the present invention to provide a PLL circuit and a frequency division method in which the above-described disadvantages are eliminated.

A more specific object of the present invention is to provide a simple PLL circuit for reducing spurious noise included in an oscillation output and a frequency division method by means of the simple PLL circuit.

The above objects of the present invention are achieved by a phase-locked loop (PLL) circuit performing a fractional division which circuit includes a phase comparator circuit comparing phases of two signals and outputting first and second phase difference signals based on a phase difference between the two signals, a phase difference signal modulation circuit modulating the second phase difference signals into third phase difference signals, and an oscillator circuit oscillating based on the first and third signals.

The above-described PLL circuit is simply structured and prevents a signal that is a source of spurious noise from being supplied to the oscillator circuit by modulating the second phase difference signals.

The above objects of the present invention are also achieved by a frequency division method including the steps of (a) generating first and second phase difference signals based on a phase difference between two signals, (b) modulating the second phase difference signals into third phase difference signals, and (c) generating a signal with a desired frequency by oscillating based on the first and third phase difference signals.

The above-described method prevents a signal that is a source of spurious noise from being supplied to the oscillator circuit by modulating the second phase difference signals.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

Figure 1:
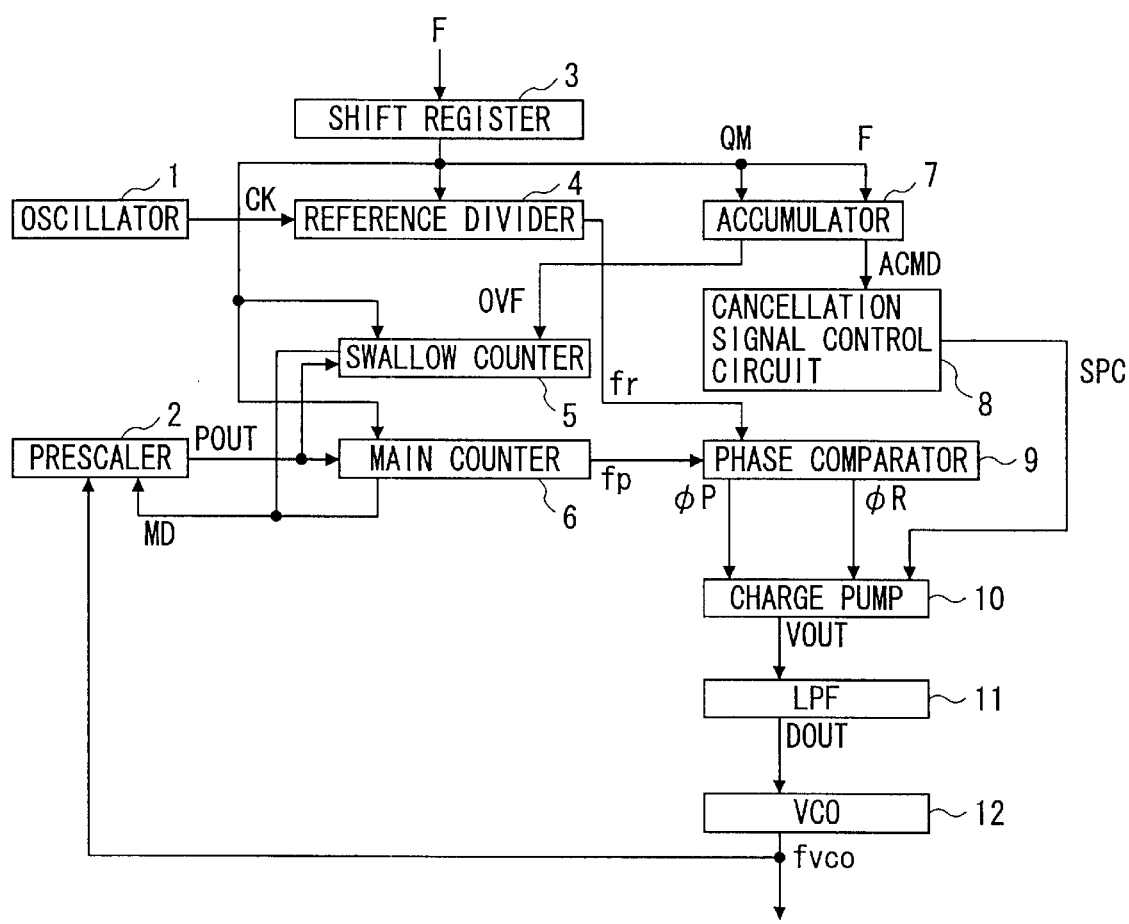
FIG. 1 is a diagram showing a structure of a conventional PLL circuit.

A description will now be given, with reference to the accompanying drawings, of an embodiment of the present invention. In the drawings, the same or equivalent elements are referred to by the same numerals.

Generally, spurious noise that matters in a fractional-N synthesizer results from a jitter output supplied from a phase comparator to a charge pump. In a PLL circuit according to the embodiment of the present invention, the generation of spurious noise is controlled by restricting the jitter output supplied to the charge pump.

That is, in the PLL circuit of this embodiment, a control circuits controls the output of a phase comparator and a delay in a delay circuit delaying the output of the phase comparator is controlled by a control signal output from an accumulator based on a fractional division phase difference or error, thereby modulating a signal indicating a phase difference and supplying the signal to a charge pump.

Therefore, this PLL circuit has the phase comparator controlled directly so as to dispense with such a large circuit as the cancellation signal control circuit 8 shown in FIG. 1. At the same time, the PLL circuit, while securing fast phase lock, can reliably reduce spurious noise generated in a fractional frequency division.

By simple comparison, the conventional PLL circuit of FIG. 1 is twice as large in size as the PLL circuit of this embodiment. A detailed description will now be given of the PLL circuit of this embodiment and a frequency division method by means of the PLL circuit.

Figure 3:
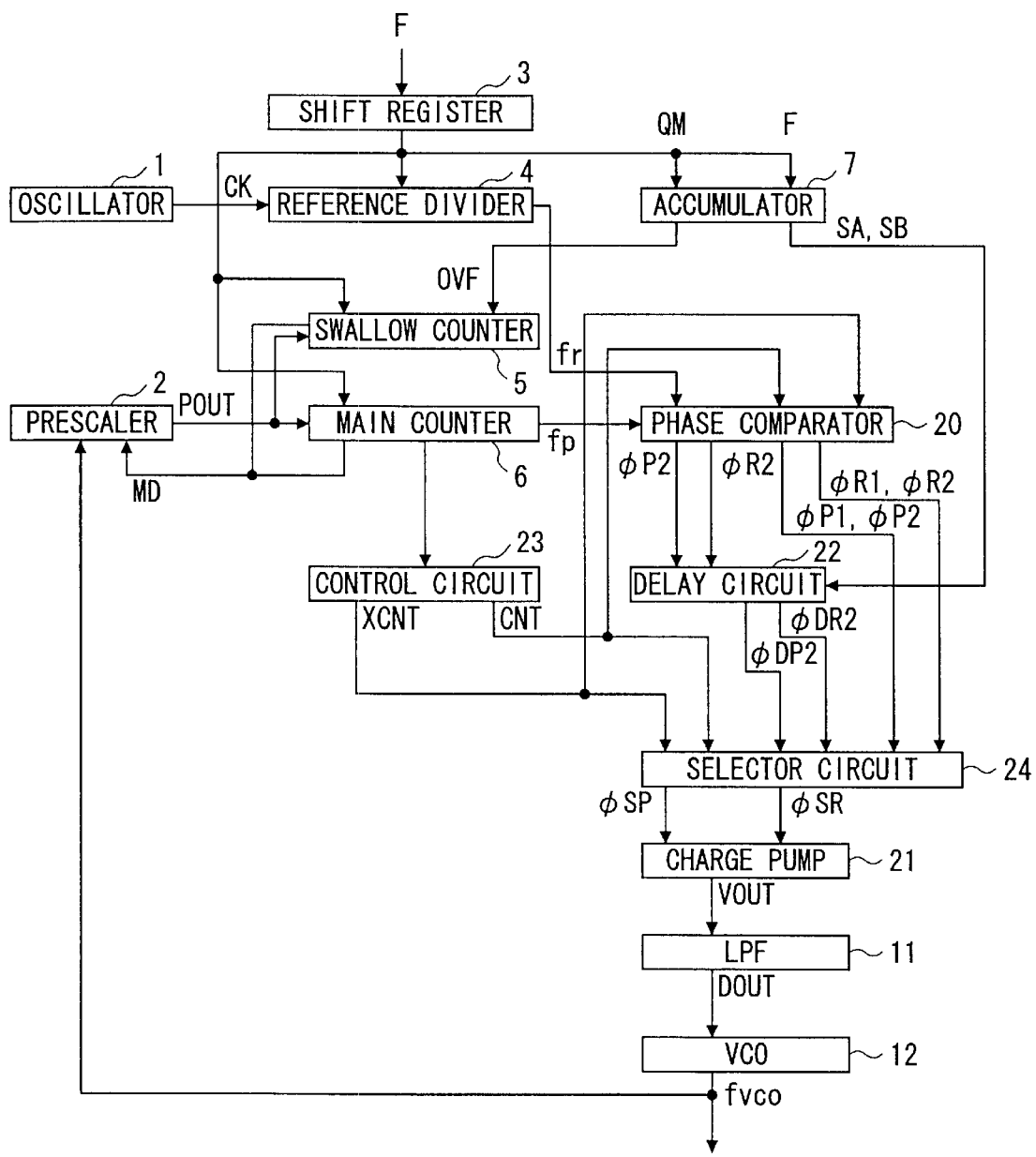
FIG. 3 is a diagram showing a structure of a PLL circuit according to an embodiment of the present invention.

FIG. 3 is a diagram showing a structure of the PLL circuit according to the embodiment of the present invention. As shown in FIG. 3, the PLL circuit of this embodiment is similar in structure to the conventional PLL circuit of FIG. 1, but differs therefrom in replacing the cancellation signal control circuit 8 shown in FIG. 1 with a delay circuit 22, a control circuit 23, and a selector circuit 24.

As shown in FIG. 3, the control circuit 23 is connected to the main counter 6, a phase comparator 20 is connected to the control circuit 23, and the delay circuit 22 is connected to the phase comparator 20 and the accumulator 7. The selector circuit 24 has its inputs connected to the control circuit 23, the delay circuit 22, and the phase comparator 20 and its output connected to a charge pump 21.

In the PLL circuit of the above-described structure, the phase comparator 20 generates signals ΦP1, ΦR1, ΦP2, and ΦR2 on the basis of control signals CNT and XCNT output from the control circuit 23 and the phase difference between the reference signal fr and the comparison frequency signal fp. As will be described later, the signals ΦP1 and ΦR1 are generated if there is no phase difference between the reference signal fr and the comparison frequency signal fp, and the signals ΦP2 and ΦR2 are generated if the phase difference exists between the reference signal fr and the comparison frequency signal fp. The phase comparator 20 supplies the signals ΦP1 and ΦR1 to the selector circuit 24 and the signals ΦP2 and ΦR2 to the delay circuit 22 and the selector circuit 24.

At this point, the delay circuit 22 generates signals ΦDP2 and ΦDR2 by delaying the signals ΦP2 and ΦR2 by a delay corresponding to control signals SA and SB supplied from the accumulator 7, and outputs the signals ΦDP2 and ΦDR2 to the selector circuit 24. The selector circuit 24 generates signals ΦSP and ΦSR from the signals ΦP1, ΦR1, ΦP2, ΦR2, ΦDP2, and ΦDR2 on the basis of the control signals CNT and XCNT supplied from the control circuit 23, and supplies the generated signals ΦSP and ΦSR to the charge pump 21.

Figure 2:
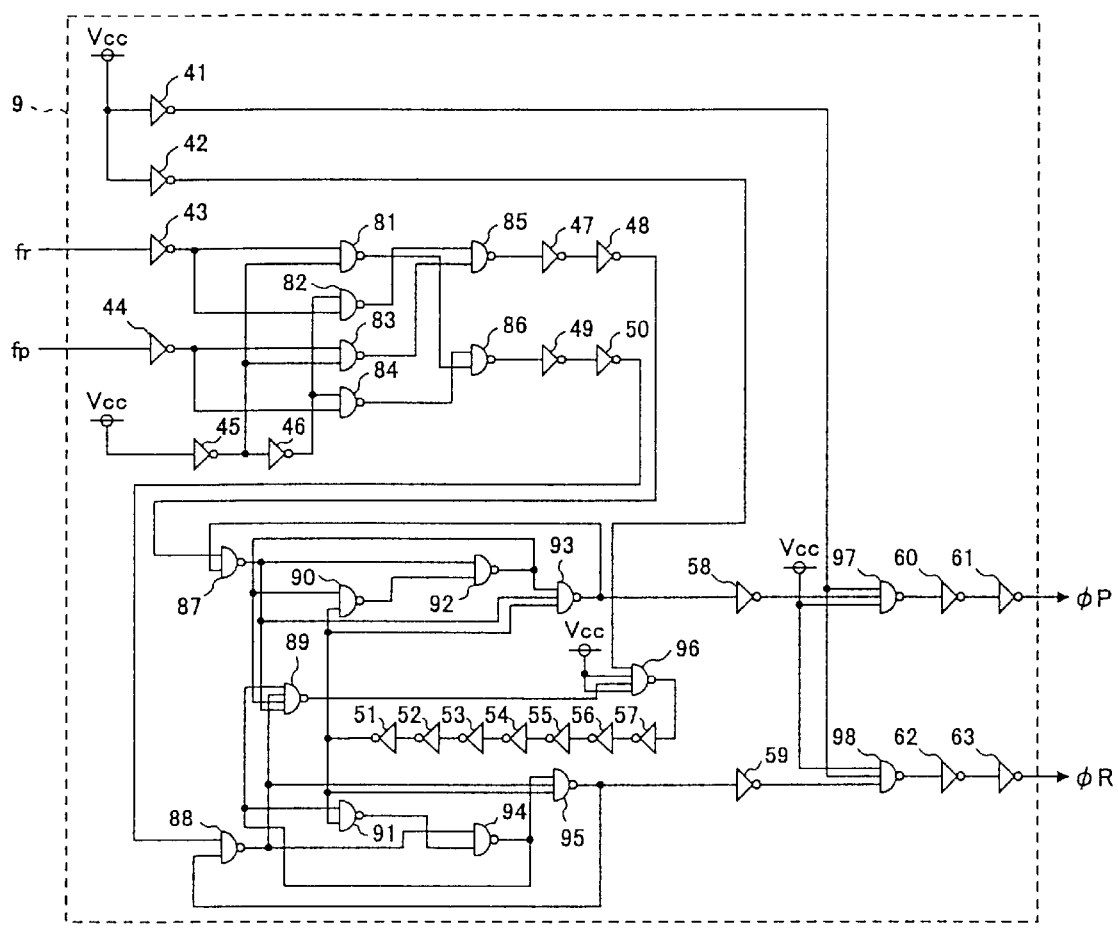
FIG. 2 is a diagram showing a structure of a phase comparator shown in FIG. 1.
Figure 4:
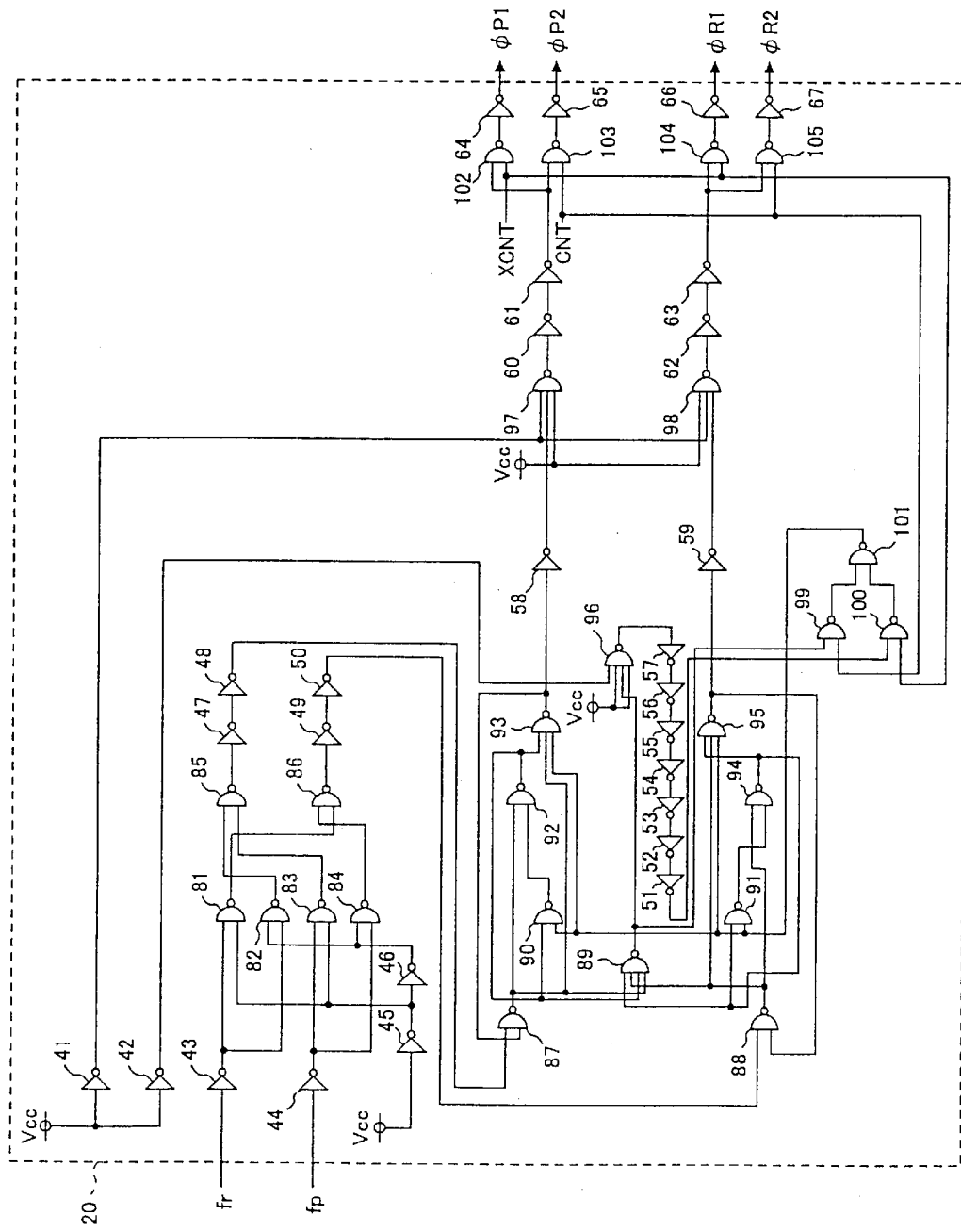
FIG. 4 is a diagram showing a structure of a phase comparator shown in FIG. 3.

Next, a description will be given of the phase comparator 20 shown in FIG. 3. FIG. 4 is a diagram showing a structure of the phase comparator 20 of FIG. 3. As shown in FIG. 4, the phase comparator 20 is similar in structure to the conventional phase comparator 9 of FIG. 2, but differs therefrom in additionally including NAND circuits 99 through 105 and inverting circuits 64 through 67.

The NAND circuit 99 has its one input connected to the NAND circuit 89 and the other input supplied with the control signal CNT. The NAND circuit 100 has its one input connected to the output of the inverting circuit 51 and the other input supplied with the control signal XCNT. The NAND circuit 101 has its two inputs connected to the outputs of the NAND circuits 99 and 100, respectively, and its output connected to an input of the NAND circuit 91.

Further, the NAND circuit 102 has its one input connected to the output of the inverting circuit 61 and the other input supplied with the control signal XCNT. Similarly, the NAND circuit 103 has its one input connected to the output of the inverting circuit 61 and the other input supplied with the control signal CNT. The NAND circuit 104 has its one input connected to the output of the inverting circuit 63 and the other input supplied with the control signal XCNT. The NAND circuit 105 has its one input connected to the output of the inverting circuit 63 and the other input supplied with the control signal CNT.

The inverting circuit 64 is connected to the NAND circuit 102 and outputs the signal ΦP1, and the inverting circuit 65 is connected to the NAND circuit 103 and outputs the signal ΦP2. Similarly, the inverting circuit 66 is connected to the NAND circuit 104 and outputs the signal ΦR1, and the inverting circuit 67 is connected to the NAND circuit 105 and outputs the signal ΦR2.

Figure 5:
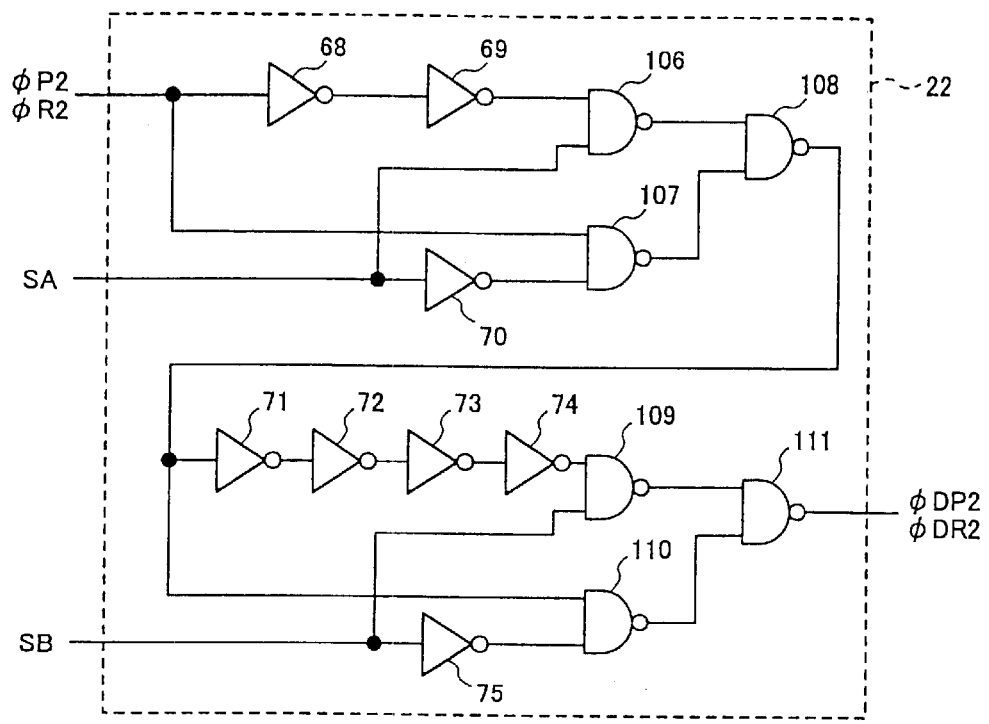
FIG. 5 is a circuit diagram for illustrating a structure of a delay circuit shown in FIG. 3.

Next, a description will be given of the delay circuit 22 shown in FIG. 3. FIG. 5 is a circuit diagram for illustrating a structure of the delay circuit 22. As shown in FIG. 5, the delay circuit 22 delays the signals ΦP2 and ΦR2 supplied from the phase comparator 20 and generates the signals ΦDP2 and ΦDR2. The delay circuit 22 includes inverting circuit 68 through 75 and NAND circuits 106 through 111.

The delay circuits 22 adjusts a delay, as shown in the following table 1, on the basis of the signals SA and SB supplied from the accumulator 7 as an accumulator value (a fractional division error), with the result that the greater the fractional division phase difference, or the accumulator value, the greater the delay.

The accumulator value corresponds to the phase difference between the reference signal fr and the comparison frequency signal fp (that is, the fractional division error) of every timing at which the fraction F is subtracted from the supplied modulus QM.

TABLE 1

| Accumulator value | SB | SA | Gate delay |
|---|---|---|---|
| 0 | L | L | 4 gates |
| 1 | L | H | 6 gates |
| 2 | H | L | 8 gates |
| 3 | H | H | 10 gates |

As shown in the table 1, if the accumulator value is 0, for instance, the levels of the signals SA and SB are both set to LOW (L). At this point, the NAND circuits 106 and 109 are inactivated. Therefore, if the accumulator value is 0, the signals ΦP2 and ΦR2 input to the delay circuit 22 are delayed for passing through the four NAND circuits 107, 108, 110, and 111, that is, the signals ΦP2 and ΦR2 are delayed by four gates. Similarly, the signals ΦP2 and ΦR2 are delayed by six gates, eight gates, and ten gates if the accumulator value is 1, 2, and 3, respectively.

In the above-described case, the accumulator value is a quaternary parameter expressed by two bits, but the accumulator value may be expressed by N bits (N: natural number) so that the delay may be adjusted more finely.

Figure 6:
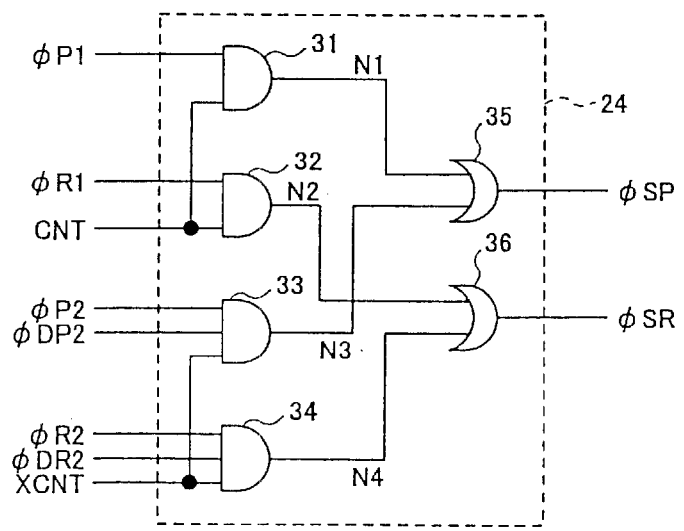
FIG. 6 is a circuit diagram showing a structure of a selector circuit shown in FIG. 3.

Next, a description will be given of the selector circuit 24 shown in FIG. 3. FIG. 6 is a circuit diagram showing a structure of the selector circuit 24. As shown in FIG. 6, the selector circuit 24 includes AND circuits 31 through 34 and OR circuits 35 and 36.

The OR circuit 35 has its two inputs connected to the AND circuits 31 and 33, respectively, and the OR circuit 36 has its two inputs connected to the AND circuits 32 and 34, respectively. The signal ΦP1 is supplied to the AND circuit 31, and the signal ΦR1 is supplied to the AND circuit 32. The signal ΦP2 is supplied to the AND circuit 33, and the signal ΦR2 is supplied to the AND circuit 34.

The signal ΦDP2 is supplied to the AND circuit 33, and the signal ΦDR2 is supplied to the AND circuit 34. The control signal CNT is supplied to the AND circuits 31 and 32, and the control signal XCNT that is the reversal signal of the control signal CNT is supplied to the AND circuits 33 and 34. The selector circuit 24 outputs the signals ΦSP and ΦSR from the OR circuits 35 and 36, respectively.

Therefore, in the selector circuit 24 having the above-described structure, if the level of the control signal CNT is set to HIGH, the level of the control signal XCNT is set to LOW, thus inactivating the AND circuits 33 and 34. Accordingly, if the level of the control signal CNT is set to HIGH, the selector circuit 24 selectively outputs the signals ΦP1 and ΦR1 as the signals ΦSP and ΦSR, respectively.

On the other hand, if the level of the control signal CNT is set to LOW, the AND circuits 31 and 32 are inactivated. Therefore, in this case, the selector circuit 24 outputs the logical product of the signals ΦP2 and ΦDP2 obtained in the AND circuit 33 and the logical product of the signals ΦR2 and ΦDR2 obtained in the AND circuit 34 as the signals ΦSP and ΦSR, respectively.

Next, a description will be given, with reference to timing charts shown in FIGS. 7 and 8, of an operation of the PLL circuit of the above-described structure according to this embodiment. The timing charts of FIGS. 7 and 8 show a case where the modulus QM is 8 and the fraction F is 1.

The phase comparator 20 is supplied with the reference signal fr shown in FIG. 7(c) from the reference divider 4 and the comparison frequency signal fp shown in FIG. 7(d) from the main counter 6. Here, if the reference signal fr and the comparison frequency signal fp are phase-matched, for instance, at a time T1, the accumulator 7 supplied the overflow signal OVF to the swallow counter 5 at this time and the swallow counter 5 changes the division ration for the comparison frequency signal fp from M to M+1. Thereby, the comparison frequency signal fp is caused to have a given phase difference with respect to the reference signal fr, and, if the modulus QM is 8, is again phase-matched with the reference signal fr at a time T2 after an eight-fr pulse-long period of time passes since the time T1.

Figure 7:
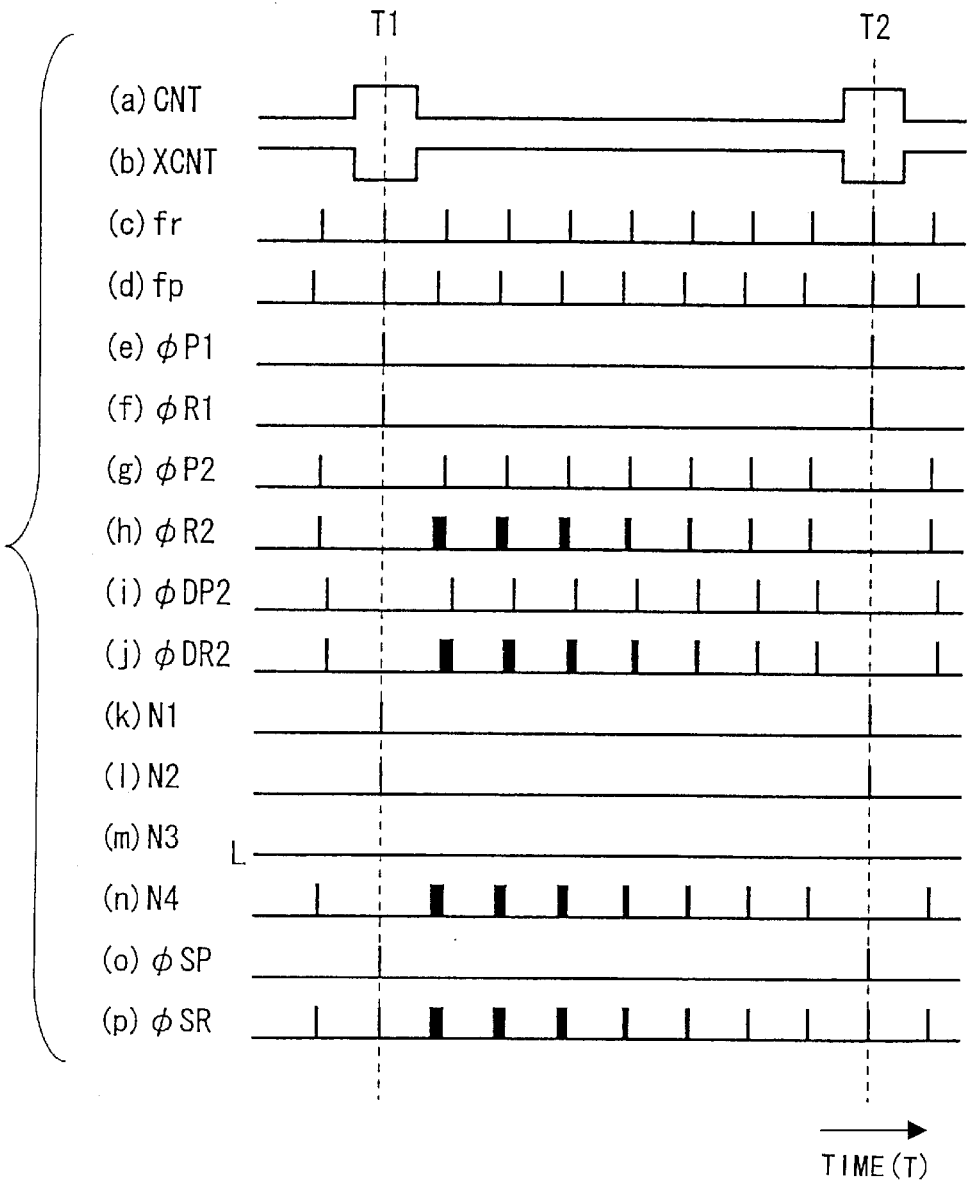
FIG. 7 is a timing chart showing an operation of the PLL circuit of FIG. 3.
Figure 8:
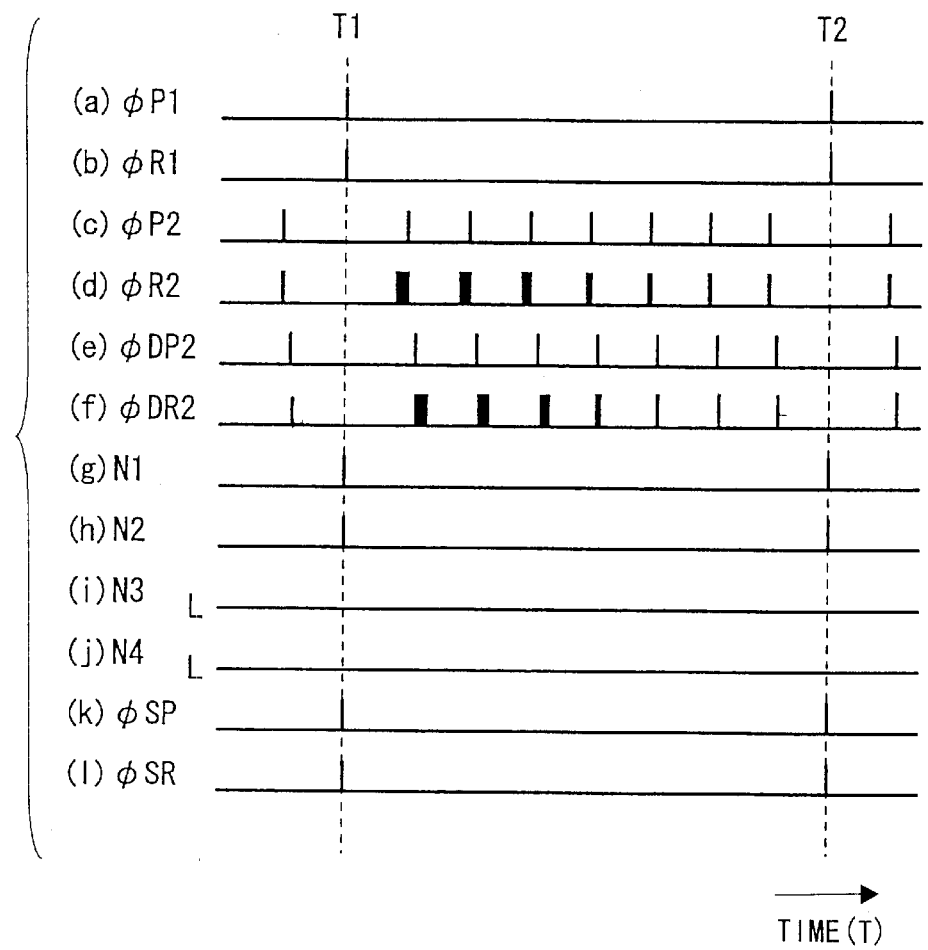
FIG. 8 is another timing chart showing an operation of the PLL circuit of FIG. 3.

On the other hand, the control circuit 23 generates the control signals CNT and XCNT shown in FIGS. 7(a) and 7(b) in accordance with a signal supplied from the main counter 6 when the main counter 6 counts up to a given number, and supplies the control signals CNT and XCNT to the phase comparator 20 and the selector circuit 24. Here, in the case shown in FIG. 7, for instance, the control signal CNT has its level set to HIGH for a given period of time around each of the times T1 and T2.

On the other hand, the phase comparator 20 of FIG. 4 generates the signals ΦP1, ΦR1, ΦP2, and ΦR2 shown in FIGS. 7(e) through 7(h), respectively. Here, the signal ΦR2 is a clock signal having a width proportional to the phase difference between the reference signal fr and the comparison frequency signal fp. Therefore, as shown in FIG. 7(h), the clock width of the signal ΦR2 gradually decreases over a period between the times T1 and T2.

The delay circuit 22 of FIG. 5 delays the signals ΦP2 and ΦR2 shown in FIGS. 7(g) and 7(h) for a give period of time, and generates the signals ΦDP2 and ΦDR2 shown in FIGS. 7(i) and 7(j).

Thereby, the selector circuit 24 of FIG. 6 outputs signals N1 and N2 shown in FIGS. 7(k) and 7(l) from the AND circuits 31 and 32, respectively. Since the AND circuits 31 and 32 are activated around the times T1 and T2, the signals N1 and N2 consequently becomes identical to the signals ΦSP and ΦSR shown in FIGS. 7(o) and 7(p).

The AND circuits 33 and 34 shown in FIG. 6, contrary to the AND circuits 31 and 32, are activated for a given period of time between the times T1 and T2, and output signals N3 and N4 shown in FIGS. 7(m) and 7(n) in the given period of time, respectively.

The signal N3, which is generated from the logical product of the signals ΦP2 and ΦDP2, is a pulse signal without a sufficient width. Therefore, the level of the signal N3 is always set to LOW as shown in FIG. 7(m). On the other hand, the signal N4, which is generated from the logical product of the signals ΦR2 and ΦDR2, is a pulse signal having the width proportional to the phase difference between the reference signal fr and the comparison frequency signal fp as described above. Therefore, the level of the signal N4 is set to HIGH over a period for which the levels of the signals ΦR2 and ΦDR2 are set to HIGH at the same time.

The selector circuit 24 outputs the signal ΦSP shown in FIG. 7(o) from the OR circuit 35 by obtaining the logical add of the signals N1 and N3, and the signal ΦSR shown in FIG. 7(p) from the OR circuit 36 by obtaining the logical add of the signals N2 and N4.

Therefore, with the phase of the comparison frequency signal fp not being locked onto the phase of the reference signal fr, that is, with the phase of the comparison frequency signal fp not being in a locked state, the signals ΦSP and ΦSR shown in FIGS. 7(o) and 7(p) are supplied to the charge pump 21, which generates the output signal VOUT based on the supplied signals ΦSP and ΦSR.

As the phase of the comparison frequency signal fp shown in FIG. 7(d) approaches that of the reference signal fr with the passage of time, the signal ΦR2 generated by the phase comparator 20 has a smaller pulse width as shown in FIG. 8(d). This makes no period of time for the signals ΦR2 and ΦDR2 shown in FIGS. 8(d) and 8(f) to have their levels set to HIGH at the same time. Therefore, the level of the signal N4 generated in the AND circuit 34 shown in FIG. 6 is always set to LOW (L) as shown in FIG. 8(j).

Accordingly, if the phase of the comparison frequency signal fp approaches that of the reference signal fr to be in the locked state, the signal ΦSR generated in the OR circuit 36 by obtaining the logical add of the signals N2 and N4 shown in FIGS. 8(h) and 8(j) has its level set to HIGH only at times T1 and T2 as shown in FIG. 8(l), thereby eliminating such a pulse signal as shown in FIG. 7(p) between the times T1 and T2, which pulse signal is a source of spurious noise.

As described above, according to the PLL circuit of this embodiment, with the phase of the comparison frequency signal fp being in the locked position, a phase difference (error) signal (a pulse signal) generated based on the phase difference between the reference signal fr and the comparison frequency signal fp is cut off, so that a signal with a conventional frequency is supplied to the charge pump 21. Therefore, spurious noise generated in a conventional fractional division is reduced.

Generally, a PLL circuit performing a fractional division generates the signal ΦR2 based on a phase difference of its own and a phase difference produced in the process of locking the phase of the comparison frequency signal fp in a state where there is a large difference between the phases of the comparison frequency signal fp and the reference signal fr before the comparison frequency signal fp is in the locked state. However, with the comparison frequency signal fp being in the locked state, the PLL circuit of the present invention cuts off a given phase difference signal so as to generate the signal ΦSR based only on its own phase difference as a signal supplied to the charge pump 21, thereby reducing spurious noise.

The present invention is not limited to the specifically disclosed embodiment, but variations and modifications may be made without departing from the scope of the present invention.

The present application is based on Japanese priority application No. 2000-320936 filed on Oct. 20, 2000, the entire contents of which are hereby incorporated by reference.

What is claimed is:

1. A phase-locked loop (PLL) circuit performing a fractional division, comprising:
    a phase comparator circuit comparing phases of two signals and outputting first and second phase difference signals based on a phase difference between the two signals;
    a phase difference signal modulation circuit modulating the second phase difference signals into third phase difference signals; and
    an oscillator circuit oscillating based on the first and third signals;
    wherein said phase difference signal modulation circuit cuts off the second phase difference signals based on the phase difference between the two signals.

2. A phase-locked loop (PLL) circuit performing a fractional division, comprising:
    a phase comparator circuit comparing phases of two signals and outputting first and second phase difference signals based on a phase difference between the two signals;
    a phase difference signal modulation circuit modulating the second phase difference signals into third phase difference signals; and
    an oscillator circuit oscillating based on the first and third signals thus performing the fractional division;
    wherein said phase difference signal modulation circuit cuts off the second phase difference signals based on the phase difference between the two signals.

3. The PLL circuit as claimed in claim 2, wherein said phase difference signal modulation circuit selectively outputs the first phase difference signals to the oscillator circuit.

4. The PLL circuit as claimed in claim 2, wherein said phase difference signal modulation circuit comprises:
    a delay circuit delaying the second phase difference signals; and
    a signal generation circuit generating the third phase difference signals based on the second phase difference signals and signals obtained by delaying the second phase difference signals and outputting the third signals to said oscillator circuit.

5. The PLL circuit as claimed in claim 4, wherein said delay circuit delays the second phase difference signals based on the phase difference between the two signals.

6. A frequency division method comprising the steps of:
    (a) generating first and second phase difference signals based on a phase difference between two signals;
    (b) modulating the second phase difference signals into third phase difference signals; and (c) generating a signal with a desired frequency by oscillating based on the first and third phase difference signals;

wherein said step (b) cuts off the second phase difference signals based on the phase difference between the two signals.

7. A fractional frequency division method comprising the steps of:
   (a) generating first and second phase difference signals based on a phase difference between two signals;
   (b) modulating the second phase difference signals into third phase difference signals; and
   (c) generating a signal with a desired frequency by oscillating based on the first and third phase difference signals thus performing the fractional frequency division;

wherein said step (b) cuts off the second phase difference signals based on the phase difference between the two signals.

8. The method as claimed in claim 7, wherein said step (b) comprises the steps of:
   (d) delaying the second phase difference signals;
   (e) generating the third phase difference signals based on the second phase difference signals and signals obtained by said step (d); and
   (f) outputting the third phase difference signals.

9. The method as claimed in claim 8, wherein said step (d) delays the second phase difference signals based on the phase difference between the two signals.

* * * * *